United States Patent

Makino et al.

[11] Patent Number: 5,921,789
[45] Date of Patent: Jul. 13, 1999

[54] CONNECTOR FOR A CIRCUIT BOARD

[75] Inventors: Hirotaka Makino; Hajime Okada, both of Yokkaichi, Japan

[73] Assignee: Sumitomo Wiring Systems, Ltd., Japan

[21] Appl. No.: 08/825,182

[22] Filed: Mar. 27, 1997

[30]    Foreign Application Priority Data

Apr. 25, 1996  [JP]  Japan .................................. 8-105518

[51] Int. Cl.⁶ ...................................................... H01R 9/09
[52] U.S. Cl. .............................................. 439/79; 439/590
[58] Field of Search .................................. 439/78, 79, 80, 439/590, 892

[56]               References Cited

U.S. PATENT DOCUMENTS

| | | | |
|---|---|---|---|
| 4,056,300 | 11/1977 | Schumacher | 439/78 |
| 5,213,514 | 5/1993 | Arai | 439/79 |
| 5,370,540 | 12/1994 | Kobayashi | 439/78 |
| 5,560,981 | 10/1996 | Ito | 439/696 |
| 5,628,638 | 5/1997 | Tojo et al. | 439/590 |
| 5,676,554 | 10/1997 | Tsuji | 439/79 |
| 5,688,129 | 11/1997 | Flaherty | 439/79 |
| 5,733,143 | 3/1998 | Ward et al. | 439/79 |

FOREIGN PATENT DOCUMENTS 62-136784  6/1987  Japan .
4-119973  10/1992  Japan .

*Primary Examiner*—Neil Abrams
*Assistant Examiner*—Brian J. Biggi
*Attorney, Agent, or Firm*—Banner & Witcoff, Ltd.

[57]              ABSTRACT

An electrical connector C for a circuit board P has elongate terminals 11 extending therefrom. An alignment plate 12 supports the ends of the terminals 11 against bending and ensures alignment of the terminals 11 with corresponding apertures of the circuit board. A guide portion 13 of the alignment plate 12 is movable relative to an attachment portion so as to accommodate relative thermal expansion and thereby reduces stress on the electrical connection between the terminals 11 and the circuit board P.

15 Claims, 8 Drawing Sheets

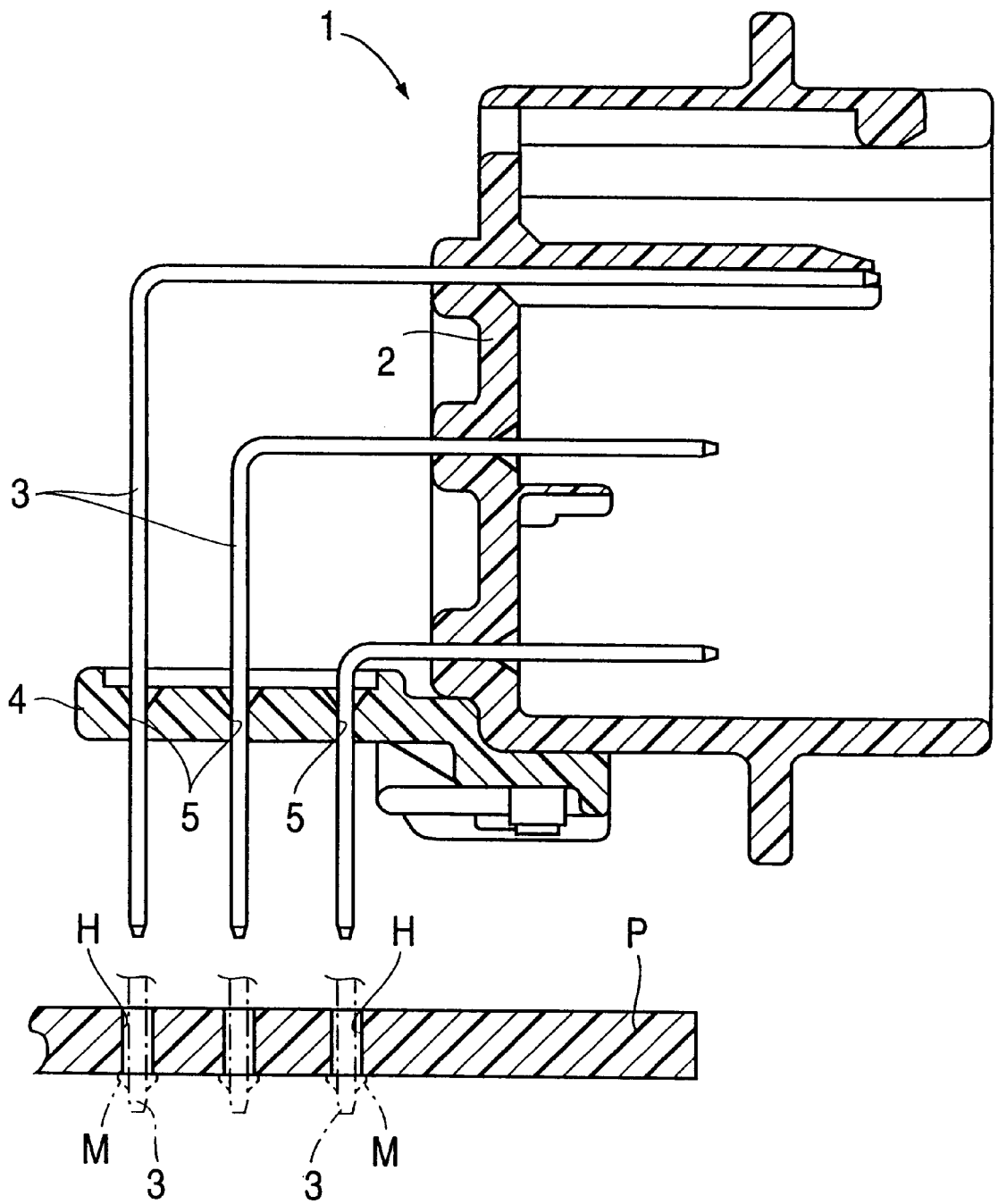

CONNECTOR FOR A CIRCUIT BOARD

FIELD OF THE INVENTION

The present invention relates to a base plate connector for attachment to a circuit board.

DESCRIPTION OF THE PRIOR ART

As shown in FIG. 18, a base plate connector has a plurality of long and thin terminals 3 which protrude from the rear face of a connector housing 2 and bend downwards. The anterior ends of the terminals 3 are aligned so as to fit with connecting holes H formed in a circuit board P. It is arranged so that, when attachment is carried out, the connector housing 2 is fixed at a specified position on the circuit board P, the anterior end of the terminals 3 being inserted into the connecting holes H and being fixed by means of soldering M.

The connector housing 2 has an alignment plate 4 fixed thereon, this alignment plate 4 serving as a guide means for carrying out the insertion operation of the terminals 3 into the connecting hole H. The alignment plate 4 has position fixing holes 5 that correspond to the connecting holes H on the circuit base plate P. The anterior ends of the terminals 3 pass through the position fixing holes 5 and as a consequence the terminals 3 are positioned and aligned with the connecting holes H.

When the base plate connector 1 is attached to the circuit board P, if the connector housing 2, the alignment plate 4, and the circuit board P undergo thermal expansion, due to the differing rates of thermal expansion of the different materials used, there is a possibility of a force applying so as to cause a relative shift in position between the position fixing holes 5 and the connecting holes H along a direction perpendicular to the axis of the terminals 3.

However, in the case of the conventional alignment plate 4, since it is necessary to fix the position of the terminals 3 with a high degree of accuracy, the position fixing holes 5 are arranged to be of the minimum necessary size in order to prevent sideways movement of the terminals 3. For this reason, if a force applies so that the position fixing holes 5 shift in position with respect of the connecting holes H, this force is transmitted to the soldered portions M via the terminals 3, and stress on the soldered portions M increases.

SUMMARY OF THE INVENTION

The present invention has been developed after taking the above problem into account, and aims to reduce stress on the soldered portions joining the terminals to the circuit board.

In accordance with the present invention, a connector for a circuit board includes a housing, elongate terminals to be soldered into connecting holes within a circuit board, and an alignment plate with position fixing holes for guiding the terminals into the connecting holes. The alignment plate includes an attachment portion adapted to be fixed relative to the housing. However, to accommodate differing thermal expansion rates of the different parts, the alignment plate includes means whereby the alignment plate supporting the terminals can move relative to the housing and the circuit board to avoid damaging the soldered connection.

DESCRIPTION OF THE DRAWINGS

Other features of the invention will be apparent from the following description of several preferred embodiments shown by way of example only in the accompanying drawings in which:

FIG. 18 is a cross-sectional view of an alignment plate of a known type.

DESCRIPTION OF PREFERRED EMBODIMENTS

Figure 1:
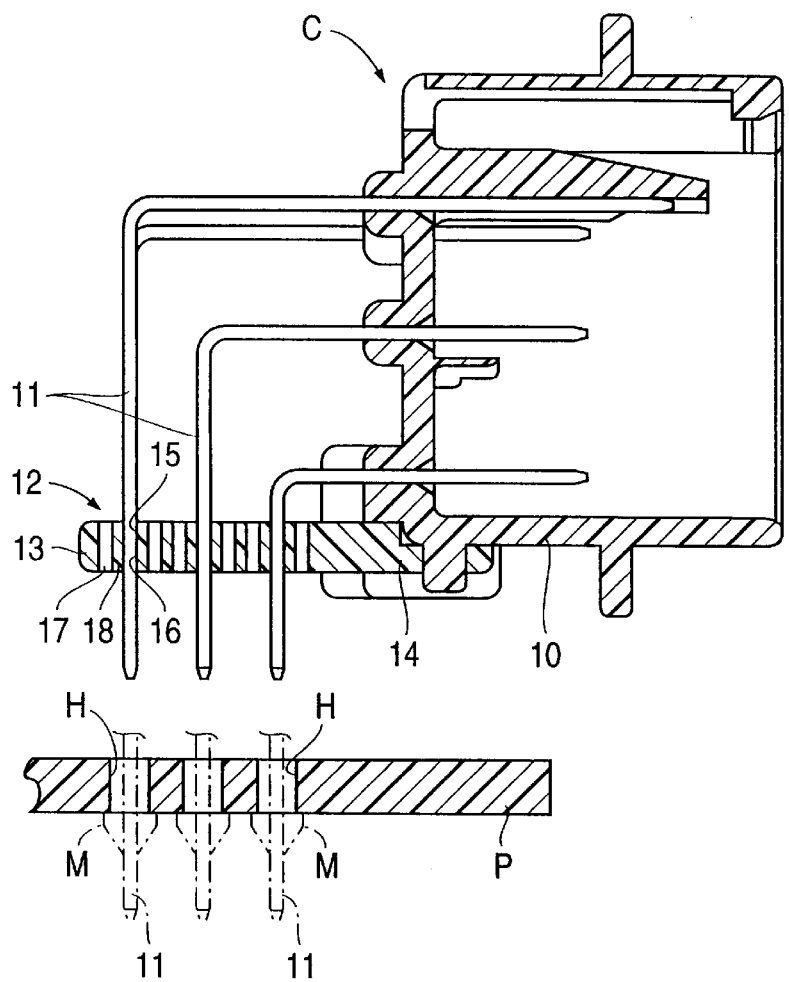
FIG. 1 is a cross-sectional view of embodiment 4 of the present invention.

A first embodiment 1 of the present invention is explained hereinbelow with reference to FIGS. 1 to 4.

A circuit board connector C of the present embodiment has a connector housing 10, which is attached by making its lower face make contact with the surface of a circuit board P, the connector housing 10 then being fixed by means of a fixing means (not shown) such as screws or the like to a specified position on the circuit board P.

A plurality of terminals 11 extend from the connector housing 10. Each terminal 11 protrudes from the rear face of the connector housing 10 and is bent in a downwards direction, its anterior end forming a right angle with respect to the lower face of the connector housing 10 and extending in a downward direction beyond the lower face. The anterior ends of these terminals 11 are arranged to be insertable simultaneously into connecting holes H of the circuit board P. For this purpose, the anterior ends of the terminals 11 are mutually parallel and the relative mutual alignment of the anterior ends of the terminals 11 is arranged to correspond to that of the connecting holes H of the circuit board P.

If the housing 10 has many projecting terminals 11, it may be difficult to attach on the circuit board P. Accordingly the connector housing 10 further comprises an alignment plate 12 which has a main plate or guide portion 13 and three attachment members 14 extending from the edges of the main plate 13. These attachment members 14 are fixed to the lower face of the connector housing 10, the alignment plate 12 accordingly being fixed and attached to the connector housing 10.

The main plate 13 has a plurality of position fixing holes 15 therethrough from the lower face through to the upper face thereof, the position fixing holes 15 being arranged so as to correspond to the connecting holes H of the circuit board P. As shown in the enlarged view of FIG. 3, the position fixing holes 15 have a rectangular shape so as to correspond to the cross-sectional shape of the terminals 11. The dimensions of the vertical and horizontal edges of the open ends of each position fixing hole 15 are set to be greater than that of the terminal 11, and supporting protrusions 16 are formed in the central portion of the edges of each open end. Each position fixing hole 15 allows a corresponding terminal 11 to pass therethrough. By contact of the four protrusions 16 on a respective terminal 11 that has been passed through a particular position fixing hole 15, the mutual positioning of the terminals 11 is arranged to correspond to the alignment of the connecting holes H with a high degree of accuracy. The alignment plate 12 is attached to the connector housing 10 in the state where the terminals 11 are arranged as described above.

Moreover, each position fixing hole 15 is surrounded on its four sides by four throughholes 17, each throughhole 17 having a cross-section which is elongate with rounded ends. Each throughhole 17 is parallel to the respective side of the fixing hole 15. The region between each of the throughholes 17 and the position fixing hole 15 forms a bendable member 18.

The portion which is bound by the four bendable members 18 and includes the position fixing hole 15 forms a movable region 19. When a force that exceeds a specified amount applies in a direction perpendicular to that of the terminals 11, this movable region 19 is arranged to move relative to the attachment members 14, accompanied by the resilient bending of the bendable members 18. The force required for bending the bendable member 18 is greater than the force required to correct the position displacement of the terminal 11, and is less than a force that would produce a crack in the portion M soldered with the circuit board P of the terminal 11.

The operation of the first embodiment will now be described. Before the attachment to the circuit base plate P is carried out, the terminals 11 and the alignment plate 12 are attached to the connector housing 10. This operation is carried out by causing the alignment plate 12 to approach the terminals 11 from below and passing the terminals 11 into the position fixing holes 15. At this juncture, if there are any terminals 11 that are displaced from their true positions, the positions of these terminals 11 are corrected and they are fitted into the position fixing holes 15. Accordingly, the positioning of all the terminals 11 is made to correspond to the alignment of the connecting holes H with a high degree of accuracy. Thereafter, the alignment plate 12 is attached to the connector housing 10.

Where a terminal 11 is displaced from its position, the resilient recovery force of this terminal 11 applies to the bendable member 18. However, as described above, the bendable member 18 possesses a certain amount of strength, and since the force capable of causing a resilient bending of the bendable member 18 is set to be greater than the force necessary to correct the position of the terminal 11 that has been dislocated, the bendable member 18 does not bend due to the recovery force of this terminal 11. As a result, the terminal 11 is fixed in position accurately.

The connector C, in which the attachment of the terminals 11 and the attachment plate 12 to the connector housing 10 has been completed, is then attached to the circuit board P. During attachment, first the anterior ends of the terminals 11, which have been aligned by means of the alignment plate 12, are inserted into the connecting holes H of the circuit board P. At this juncture, since all the terminals 11 are aligned to correspond to the arrangement of the connecting holes H, all the terminals 11 simultaneously and smoothly enter the connecting holes H. After the terminals 11 have been inserted, the terminals 11 are pushed in further, thereby bringing the alignment plate 12 closer to the circuit board P. Then, the connector housing 10 is fixed in a specified position on the circuit board P, and the portions of the terminals 11 that have been inserted into the connecting holes H are fixed by means of soldering M. In this way, the attachment of the base plate connector C to the circuit board P is completed.

After attachment, if the circuit board P, the connector housing 10 and the alignment plate 12 undergo expansion, there is a possibility of the alignment plate 12 moving relative to the circuit board P in a direction parallel to the surface of the circuit board P if the amount and direction of expansion differ. However, since in the present embodiment the movable region 19, which includes the position fixing holes 15, is arranged to be movable relative to the main plate 13, the attachment member 14 and the connector housing 10, the relative displacement of the alignment plate 12 and the circuit board P is accommodated due to the bending of the bendable member 18 (see FIG. 4), and the position fixing holes 15 are maintained in a constant position with respect to the connecting holes H. At this point, the recovery force of the bendable member 18 applies to the terminals 11 via the protecting protrusions 16. However, as described above, since the force that causes the bending of the bendable member 18 is set to be lower than a force that could cause a crack in the soldered portion, the integrity of the soldered connection M is maintained.

Next, a second embodiment of the present invention is explained hereinbelow, with reference to FIGS. 5 to 10. The second embodiment differs from the first embodiment in that the configuration of the alignment plate is different. Since the second embodiment is the same as the first embodiment in all other respects, the same number as in the first embodiment is accorded to each similar part and an explanation of the configuration, operation and effect thereof is omitted.

An alignment plate 20 of the second embodiment comprises a long and narrow attachment member 21 which is attached to the base face of a connector housing 10 by being fixed thereto, and three sub-plates 23 (the movable region) which have position fixing holes 22 formed thereon.

Each sub-plate 23 has a plurality of the position fixing holes 22 formed thereon, these position fixing holes 22 having the same alignment as connecting holes H provided on a circuit board P. Each position hole 22 is arranged to allow a respective terminal 11 to be fitted tightly therein. Moreover, the sub-plates 23 are arranged to make contact so as to fit tightly with the surface of the circuit board P when they are in a fitted state with the circuit board P.

The three sub-plates 23 are arranged along the lengthwise direction of the attachment member 21, and the mutually adjacent sub-plates 23 are connected in twos in a unified manner by two connecting members 24. Furthermore, the three sub-plates 23, which are formed integrally by means of these connecting members 24, are supported integrally by the attachment member 21 by means of four supporting members 25. Among these four supporting members 25, the two at the extreme ends are connected directly to the aligning plates 23, whilst the two medial supporting members 25 are connected to the connecting members 24.

These supporting members 25 and connecting members 24 are arranged to be strong enough to support the sub-plates 23 without allowing them to bend too easily towards the attachment member 21. Moreover, the supporting members 25 and the connecting members 24 are arranged so as not to interfere with the terminals 11 on the face extending along the alignment plate 20.

Figure 10:
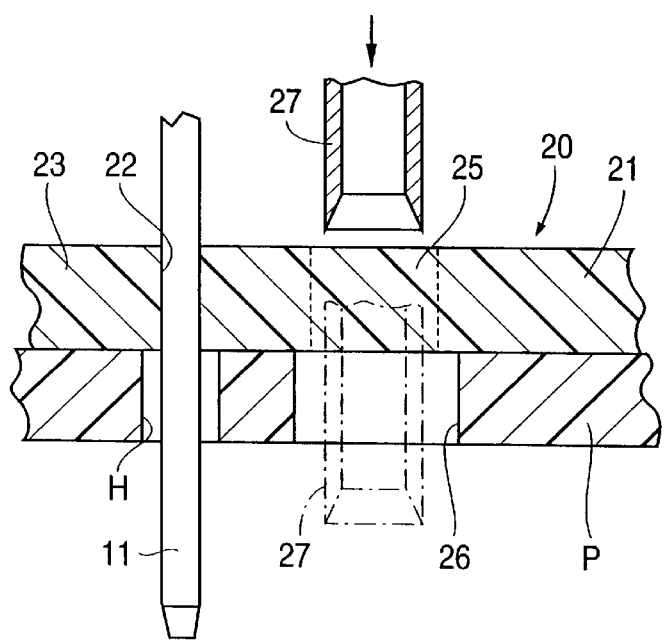
FIG. 10 is a partially enlarged cross-sectional view of the alignment of FIG. 5 showing an operation according to which the supporting member is cut.
Figure 2:
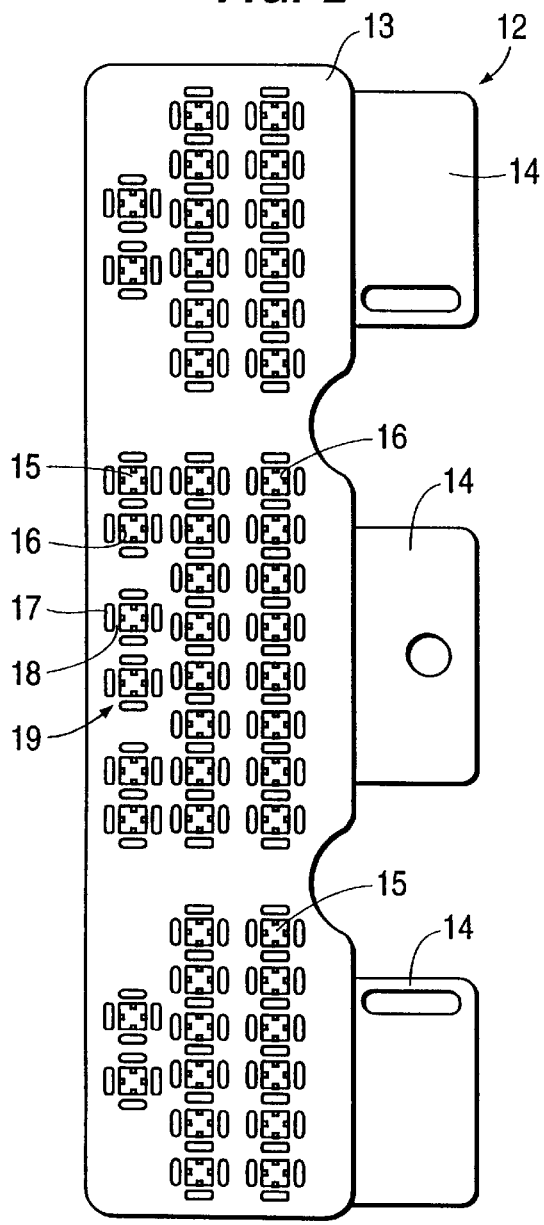
FIG. 2 is a plan view of the alignment plate of FIG. 1.
Figure 3:
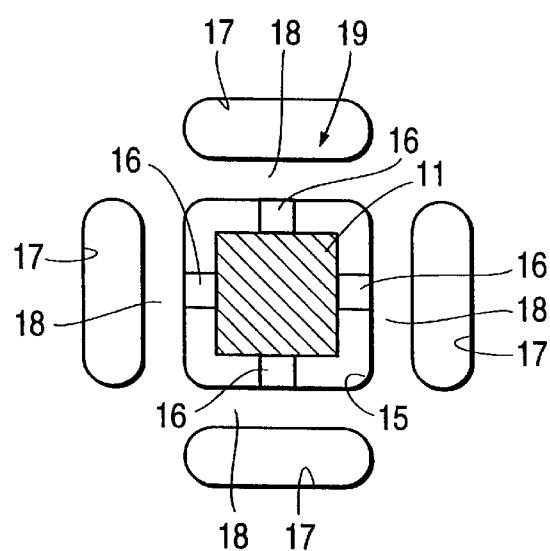
FIG. 3 is a partially enlarged plan view of the alignment plate of FIG. 1 showing a state where the terminals in embodiment 1 are aligned.
Figure 4:
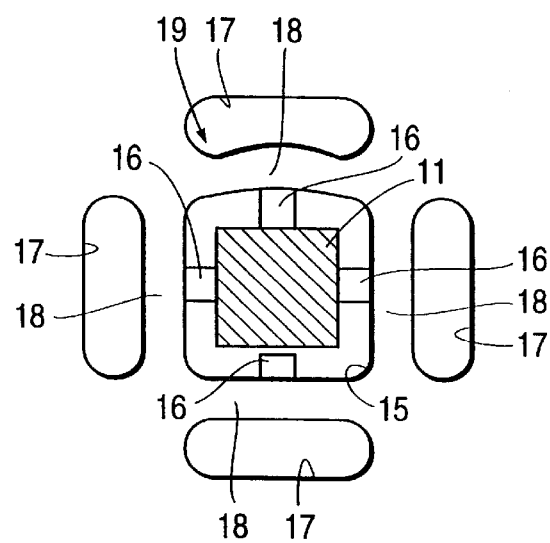
FIG. 4 is a partially enlarged plan view of the alignment plate of FIG. 1 showing a state where the movable region has moved relative to the connector housing in the first embodiment.
Figure 5:
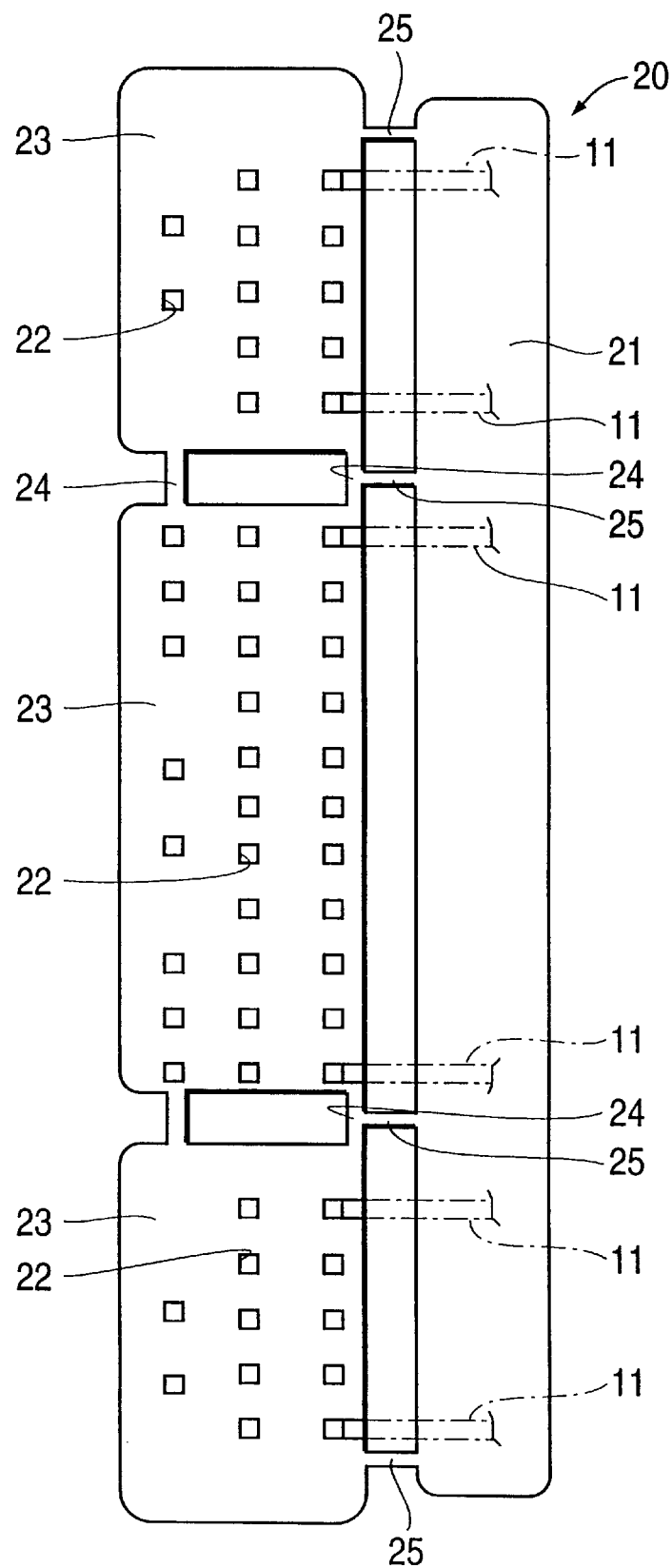
FIG. 5 is a plan view of an alignment plate of a second embodiment.
Figure 6:
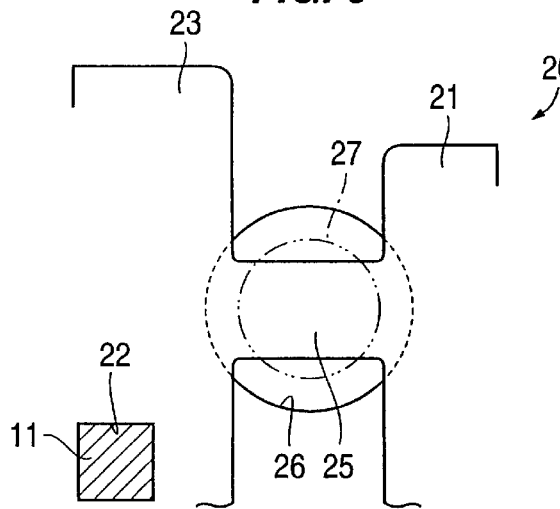
FIG. 6 is a partially enlarged plan view of the alignment plate of FIG. 5 showing a state where the supporting member corresponds to the receiving hole of the circuit board.
Figure 8:
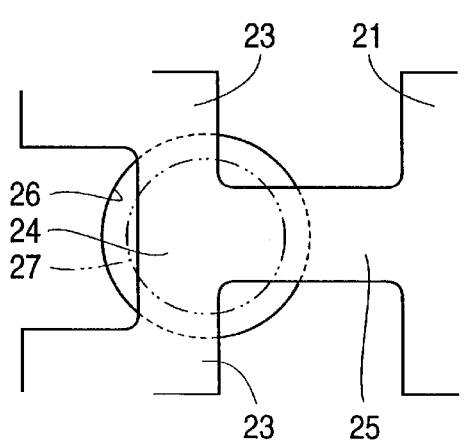
FIG. 8 is a partially enlarged cross-sectional view of the alignment plate for FIG. 5 showing a state where the connecting member and the supporting member correspond to the receiving hole of the circuit board.

The circuit board P has receiving holes 26 that correspond to the supporting members 25 and the connecting members 24 when the base plate connector C is in an attached state to the circuit board P (see FIGS. 6 and 8). During the process following the attachment of the connector C to the circuit board P, a cutter 27 cuts through the supporting members 25 and connecting members 24 (see FIGS. 6 and 8). As shown in FIG. 10, the cutter 27 straddles the alignment plate 20 and is provided so as to correspond to the receiving holes 26. The cutter 27 cuts through the supporting member 25 of the connecting member 24 and enters the receiving hole 26. This cutter 27 has a cylindrical shape and its open end constitutes a sharp circular blade. Due to this, when the supporting member 25 and the connecting member 24 are cut through, a portion corresponding to the inner tubular shape of the cutter 27 remains uncut.

Next, the operation of the second embodiment is explained. Before the attachment to the circuit board P is carried out, the terminals 11 are inserted into the position fixing holes 22 and the attachment member 21 of the alignment plate 20 is fixed to the connector housing 10. At this juncture, if there is a dislocated terminal 11, its position is corrected and it is inserted into the position fixing hole 22. As a result, the positioning of all the terminals 11 comes to be aligned so as to correspond to a high degree to the alignment of the connecting holes H.

After this, the connector C is attached to the circuit board P. During attachment, first the anterior ends of the terminals 11 are inserted into the connecting holes H, and since at this juncture all the terminals 11 are arranged to correspond to the alignment of the connecting holes H, all the terminals 11 enter the connecting holes H simultaneously and smoothly.

Once the terminals 11 are inserted, they are pushed in further so that the alignment plate 20 fits snugly with the circuit board P, and the connector housing 10 is fixed to a specified position on the circuit board plate P and is attached thereto.

Figure 7:
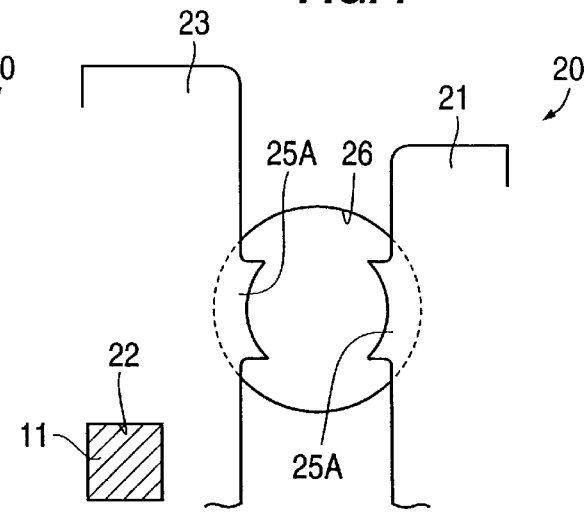
FIG. 7 is a partially enlarged cross-sectional view of the alignment plate of FIG. 5 showing a state where the supporting member has been broken.
Figure 9:
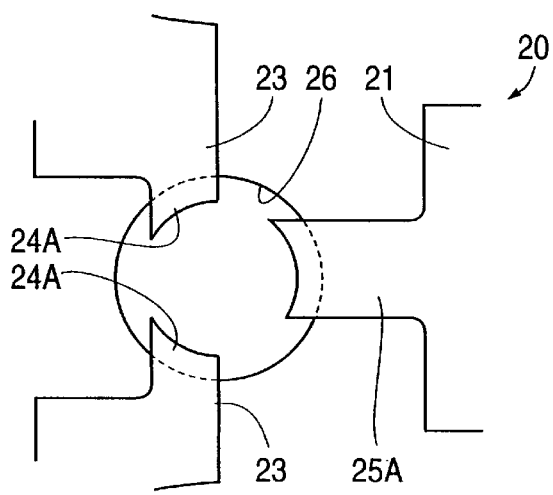
FIG. 9 is a partially enlarged cross-sectional view of the alignment plate of FIG. 5 showing a state where the connecting member and the supporting member have been cut.
Figure 11:
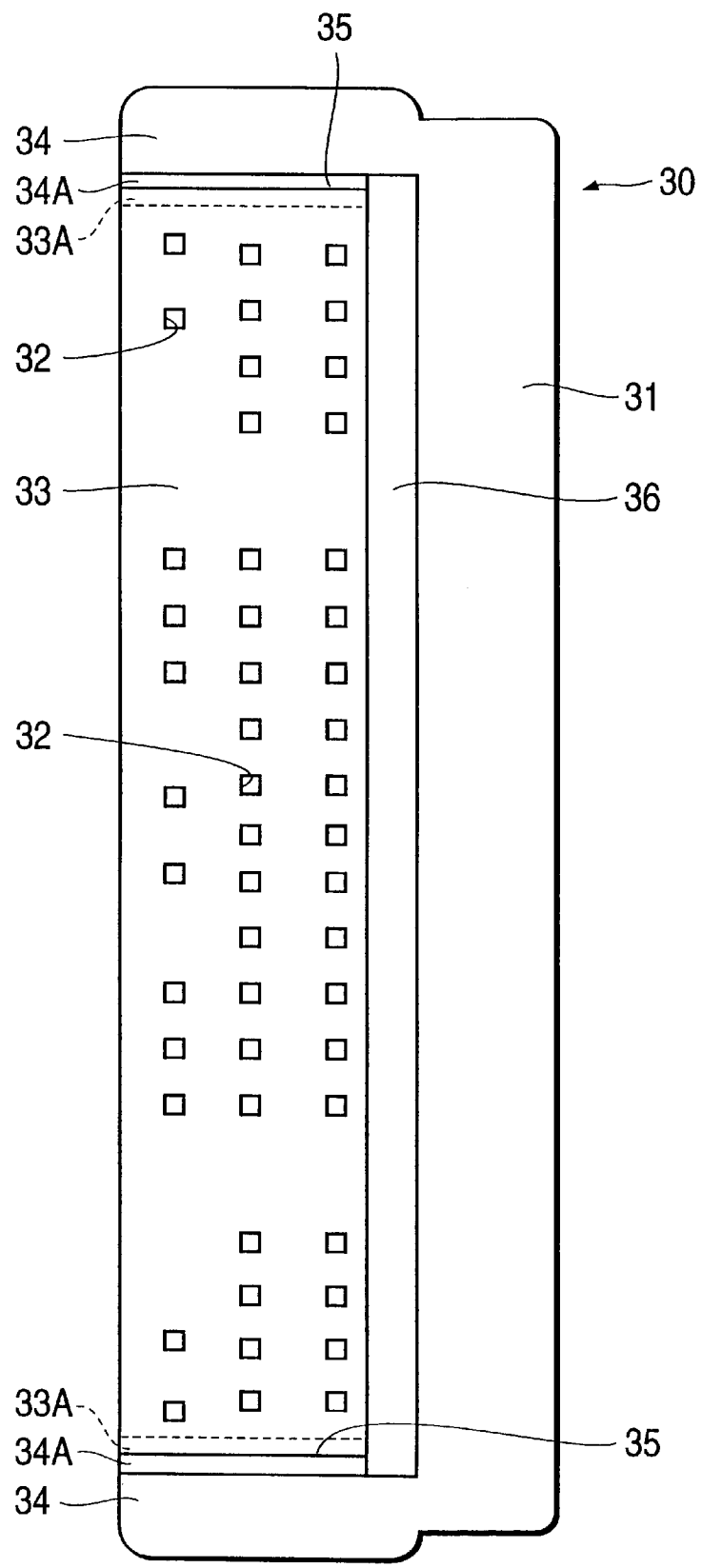
FIG. 11 is a plan view of an alignment plate of a third embodiment.

Thereafter, as shown in FIG. 10, the cutter 27 is operated so as to cut through the supporting member 25 and the connecting member 24. When this is done, as shown in FIGS. 7 and 9, a portion in the supporting member 25 and of the connecting member 24 corresponding to the inner tubular shape of the cutter 27 remains uncut and a space is formed respectively between residual portions 25A of the supporting members 25, between residual portions 24A of the connecting members 24, and between the residual portions 25A of the supporting member 25 and the residual portions 24A of the connecting members 24. Due to this space, relative movement parallel to the surface of the circuit board P becomes possible between the aligning plates 23 and between the sub-plates 23 and the attachment member 21.

Moreover, when the cutter 27 carries out the cutting, as shown in FIG. 10, since the alignment plate 20 is making contact with the circuit board P, the cutting operation of the cutter 27 is carried out in a supported and stable manner. Further, since the cutter 27 enters the respective receiving hole 26 after passing through the supporting member 25 or the connecting member 24, the cutting is carried out with certainty.

In this manner, once the cutting away of the aligning plate 23 from the attachment member 21 and the mutual cutting away of the sub-plates 23 is accomplished, the inserted portion of each terminal 11 in each connecting hole H is soldered. With this, the attachment operation of the connector C to the circuit board P is completed.

After attachment, even if due to the thermal expansion effect the connector housing 10 and the attachment member 21 move in a parallel manner with respect to the circuit board P, since movement is allowed between the sub-plates 23 which have the position fixing holes 22, and the attachment member 21, there is no possibility of the movement of the attachment member 21 affecting the sub-plates 23. As a result, the position fixing holes are maintained in a fixed position with respect to the connecting holes H. Furthermore, since the sub-plates 23 are also mutually separated, even if thermal expansion occurs at the extreme ends of the sub-plates 23, the effect of this thermal expansion does not extend to the neighbouring sub-plates 23.

In this way, according to the second embodiment, by separating the sub-plates 23, which have the position fixing holes 22 formed thereon, from the attachment member 21, and allowing the sub-plates 23 to move, the dislocation of the position fixing holes 22 with respect to the connecting holes H is prevented. Accordingly, increase in stress on the soldered portion M resulting from the dislocation of the position fixing holes 22 with respect to the connecting holes H is prevented.

Next, a third embodiment of the present invention is explained hereinbelow, with reference to FIGS. 11 to 14.

The present embodiment differs from the first embodiment in that the configuration of the alignment plate is different. Since the third embodiment is the same as the first embodiment in all other respects, the same number as in the first embodiment is accorded to each similar part and an explanation of the configuration, operation and effect thereof is omitted.

An alignment plate 30 of the present embodiment comprises a long and narrow attachment member 31 which is attached to the base face of a connector housing 10 by being fixed thereto, and sub-plates or guide portion 33 (the movable region) which have position fixing holes 32 formed thereon.

Figure 12:
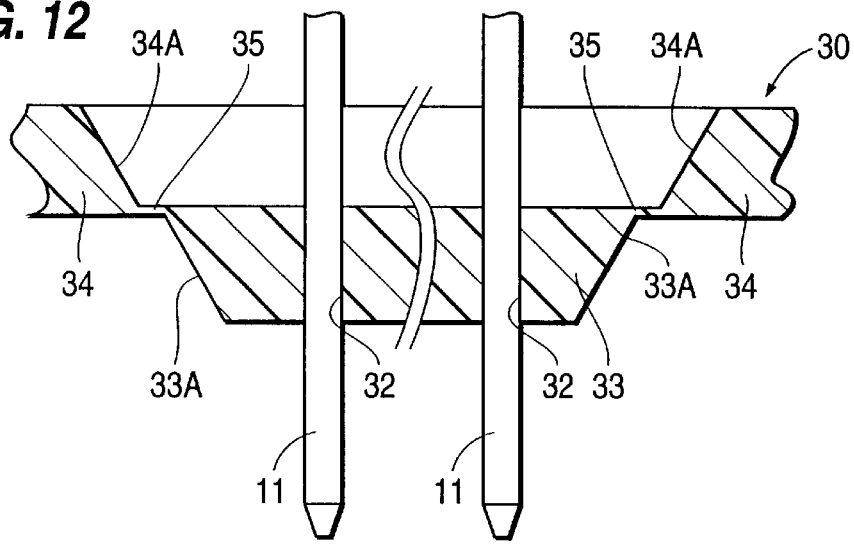
FIG. 12 is a partially enlarged cross-sectional view of the alignment plate of FIG. 11 showing a state where the terminals have been aligned.
Figure 13:
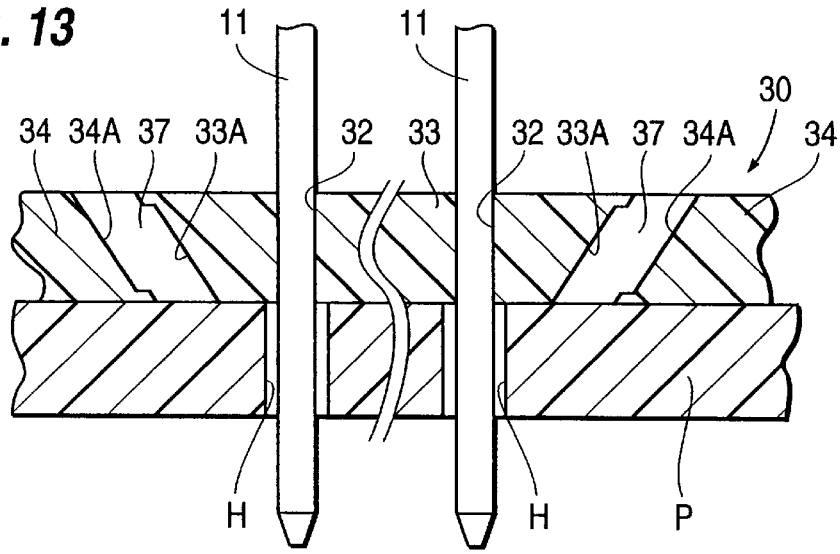
FIG. 13 is a partially enlarged cross-sectional view of the alignment plate of FIG. 11 showing a state where the movable region has been cut away.
Figure 14:
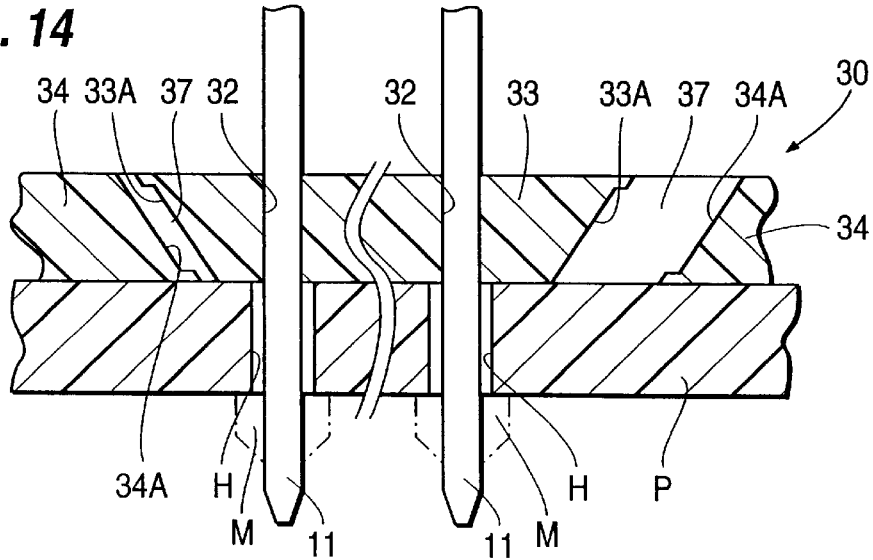
FIG. 14 is a partially enlarged cross-sectional view of the alignment plate of FIG. 11 showing a state where the main plate has moved with respect to the circuit base plate.

The ends of the attachment member 31 have a pair of arm members 34 formed so as to project at a right angle to the lengthwise direction of the attachment member 31. The sub-plate 33 has the same thickness as the arm member 34, and, as shown in FIG. 12, protrudes in a downward direction (towards the face facing the circuit board P) in a stepped shape, the stepped portion being approximately as thick as the thickness of the arm member 34. Moreover, an inner side face 34A of the edge corresponding to the sub-plate 33 of the arm member 34 inclines so as to approach the sub-plate 33, in the direction of protrusion of the sub-plate 33. Further, an external side face 33A of the edge corresponding to the arm member 34 of the sub-plate 33 inclines by the same angle and in the same direction as the edge of this corresponding arm member 34. The lower edge of the inner side face 34A of the arm member 34 and the upper edge of the outer side face 33A of the sub-plate 33 approach each other mutually. These edges are connected in a unified manner by means of a supporting member 35. Due to the supporting member 35 the sub-plate 33 is supported by the attachment member 31 via the arm member 34. Furthermore, a long and narrow space 36 is formed between the sub-plate 33 and the attachment member 31 along their lengthwise direction.

The supporting member 35 has sufficient strength to hold the sub-plate 33 in a specified supported position with respect to the arm member 34. However, if a force greater than a specified amount is applied in a direction perpendicular to the face of the alignment plate 30 (that is, the attachment direction with respect to the circuit board P), the supporting member 35 is designed to break.

Further, the sub-plate 33 has a plurality of position fixing holes 32 arranged so as to correspond to the connecting holes H of the circuit board P, as in the case of the second embodiment. When terminals 11 are passed through respective position fixing holes 32, the terminals 11 are aligned so as to correspond to the connecting holes H.

Next, the operation of the third embodiment is described. Before the attachment to the circuit board P is carried out, the terminals 11 are aligned by being inserted into the position fixing holes 32 and the attachment member 31 of the alignment plate 30 is fixed to the connector housing 10. After this, the connector C is attached to the circuit board P. During attachment, first the anterior ends of the terminals 11 are inserted into the connecting holes H, and since at this juncture all the terminals 11 are arranged to correspond to the alignment of the connecting holes H, all the terminals 11 enter the connecting holes H simultaneously and smoothly.

Once the anterior ends of the terminals 11 are inserted, they are pushed in further and the connector housing 10 is brought closer to the circuit board P so that the lower face of the sub-plate 33 makes contact with the circuit board P. From this state, when the connector housing 10 is pushed further into the circuit board P, a pushing force is applied from the circuit board P towards the sub-plate 33. Due to this force the supporting members 35 break and sub-plate 33 separates from the arm member 33. The separated sub-plate 33 thus comes to be housed within the arm members 34. After this, the position of the connector housing 10 is fixed to a specified location on the circuit board P, and portions of the terminals 11 that have been inserted into the connecting holes H are fixed by means of soldering M. This completes the attachment operation of the connector C to the circuit board.

In this attached state, the sub-plate 33 is separated from the attachment member 31. Moreover, since the external side face 33A of the sub-plate 3 and the inner side face 34A of the arm member are inclined in the same direction, a space 37 is maintained between them, this space 37 allowing movement relative to each other in the approaching and separating directions. Furthermore, since between the sub-plate 33 and the attachment member 31 the space 38 is maintained from the very beginning, movement in the approaching and separating directions of the sub-plate 33 and the attachment member 31 is permitted.

After attachment, even if due to the thermal expansion effect the connector housing 10 and the attachment member 31 move in a parallel manner with respect to the circuit board P, since movement takes place between the sub-plate 33, which has the position fixing holes 32, and the attachment member 31 (see FIG. 4), there is no possibility of the movement of the attachment member 31 affecting the sub-plate 33. As a result, the position fixing holes 32 are maintained in a constant position with respect to the connecting holes H.

In this way, according to the present embodiment, by separating the sub-plate 33, which has the position fixing holes 32 formed thereon, from the attachment member 31, and allowing the sub-plate 33 to move, the dislocation of the position fixing holes 32 with respect to the connecting holes H is prevented. Accordingly, increase in stress on the soldered portion M resulting from the dislocation of the position fixing holes 32 with respect to the connecting holes H is prevented.

Figure 15:
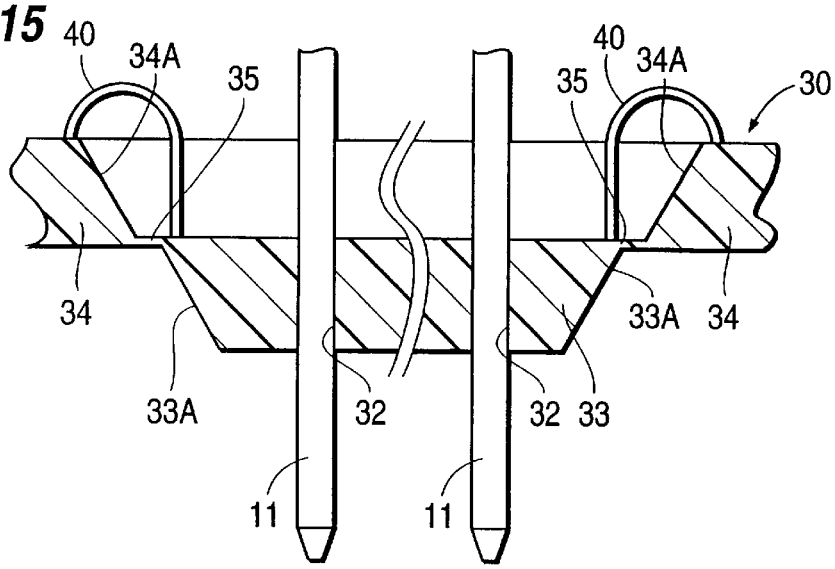
FIG. 15 is a partially enlarged cross-sectional view of an alignment of a further embodiment, showing a state where the terminals have been aligned.
Figure 16:
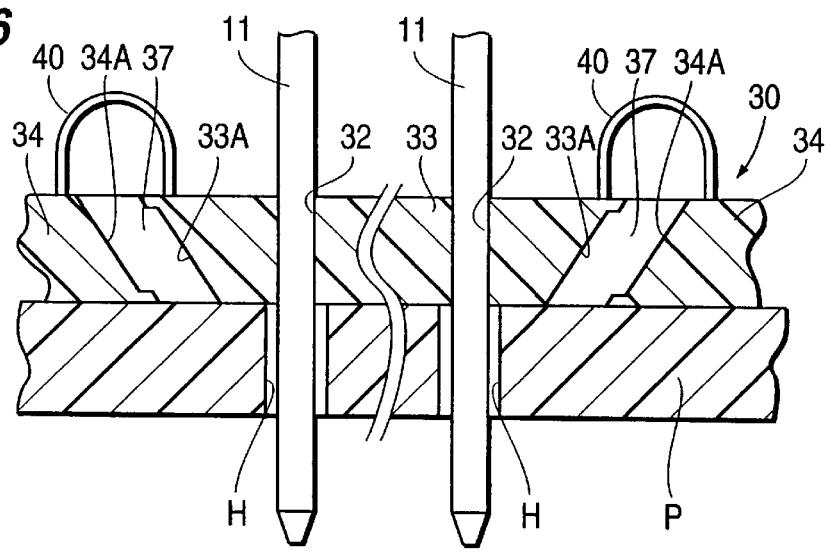
FIG. 16 is a partially enlarged cross-sectional view of the alignment plate of FIG. 15 showing a state where the movable region has been cut away.
Figure 17:
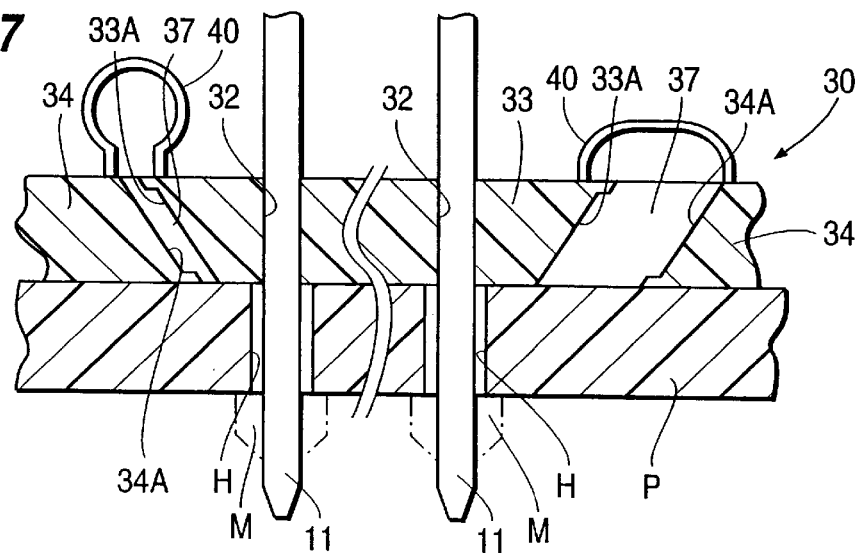
FIG. 17 is a partially enlarged cross-sectional view of the alignment plate of FIG. 15 showing a state where the main plate has moved with respect to the circuit board.

Next, a fourth embodiment of the present invention is explained hereinbelow, with reference to FIGS. 15 to 17.

The present embodiment differs from the third embodiment 3 in that a portion of the configuration of the alignment plate is different. Since the fourth embodiment is the same as the third embodiment in all other respects, the same number as in the third embodiment is accorded to each similar part and an explanation of the configuration, operation and effect thereof is omitted.

A supporting member 35 that connects an arm member 34 of an attachment member 31 and a sub-plate 33 is provided partially along the lengthwise direction of edges 33A and 34A. The portion between the arm member 34 and the sub-plate 33 that does not have the supporting member 35 has an elastically bendable, thin, flat hinge 40 formed in a bent shape. One end of this hinge 40 protrudes from a position located close to the edge 34A on the upper face of the arm member 34, the other end of the hinge 40 protruding from a position located close to the edge 33A on the upper face of the sub-plate 33. This hinge 40 connects the arm member 34 and the sub-plate 33.

Due to attachment to the circuit board P the supporting member 35 is broken and the sub-plate 33 separates from the arm member 34. When this happens, the upper face of the sub-plate 33 comes to coincide with the upper face of the arm member 34. As a result, the hinge 40 gets elastically bent. Due to the elastic recovery force of the hinge 40, the sub-plate 33 is pressed towards the circuit board P. Due to this pressing operation, the sub-plate 33 is prevented from excessively moving sideways or vertically along the terminals 11. Further, in this state, in the case where a force is applied so as to cause movement between the aligning plate 33 and the arm member 34 along the circuit base plate P, the hinge 40 elastically bends, thereby allowing mutual movement between the aligning plate 33 and the arm member 34. Consequently, there is no adverse effect on the prevention of excessive increase in force applying on the soldered portion M due to provision of the hinge 40.

The present invention is not limited to the embodiments described above with the aid of figures. For example, the possibilities described below also lie within the technical range of the present invention. Moreover, the present invention may be embodied in various other ways than those described below without deviating from the scope thereof.

(1) In the first embodiment, it may be equally arranged that the terminals are inserted into the position fixing holes and the supporting member is broken so that movement with respect to the attachment member of each movable region is allowed. In such a case, protecting protrusions need not be provided on the inner circumference of the position fixing holes, the configuration then being such that the inner peripheral face of the position fixing hole directly makes contact with the terminal and supports it.

(2) The means for breaking the supporting member and the connecting member are not limited to the ones described in the second and third embodiments. For example, it is possible to break the web by e.g. melting the supporting member and the connecting member with heat.

(3) The means for separating the movable support from the attachment member or the other movable regions in conjunction with the attachment operation of the circuit board need not be limited to that described in the third embodiment, and other means can be used such as making a cutter protrude from the surface of the circuit board and cutting the connecting member by means of this cutter.

(4) In the third embodiment, although a case was explained where the sub-plate protrudes from the attachment member in a stepped manner, in the present invention it may equally be arranged so that a plurality of sub-plates are provided and that the sub-plates protrude in a stepped shape with respect to the other sub-plates.

(5) Although in the third embodiment the inner side face of the arm member and the outer side face of the sub-plate have been provided so as to be inclined, these faces may equally have a face that forms a right angle with respect to the alignment plate. In this case, the supporting member is made longer, and a space is provided between the arm member and the sub-plate so as to allow movement with respect to each other.

(6) The number, shape and arrangement of the movable regions in each alignment plate, the number, shape and arrangement of the position fixing holes in each movable region, the number, shape and arrangement of the supporting members, and the number, shape and arrangement of the connecting members may each be different from the number, shape and arrangement described in the present embodiment.

We claim:

1. A connector for a circuit board, the connector comprising a housing for attachment to a circuit board having a connecting hole, an elongate terminal extending from the housing, the terminal having an end adapted to be electrically fixed in said connecting holes and a substantially planar alignment plate, the alignment plate comprising an attachment portion adapted to be fixed relative to the housing and a guide portion having a position fixing hole extending therethrough for receiving and supporting said terminal adjacent to said end, wherein the alignment plate further includes elongate apertures surrounding the position fixing hole and a flexible web between each said aperture and the position fixing hole so that in use the elongate terminal is adapted to be movable relative to the attachment portion due to flexing of the flexible webs to accommodate relative movement between the end of said terminal and said attachment portion in the plane of the attachment portion.

2. A connector according to claim 1 wherein the wall of said position fixing hole has internal projections for engagement with said terminal, said projections being arranged one on each flexible web.

3. A connector according to claim 1 wherein the guide portion and the attachment portion are co-planar.

4. A connector according to claim 1 wherein said guide portion defines a plurality of position fixing holes.

5. A connector according to claim 4 wherein said housing has a plurality of said terminals, each terminal corresponding to a respective position fixing hole.

6. A connector according to claim 5 wherein said terminals are substantially perpendicular to said alignment plate.

7. A connector according to claim 1 and comprising a plurality of guide portions movable relative to one another in the plane of the attachment portion.

8. A connector according to claim 7 wherein the alignment plate has one or more flexible webs to link the guide portions to each other.

9. A connector according to claim 8 and having two guide portions, said flexible web having first, second and third arms, said first and second arms being linked to respective guide portions, and said third arm being linked to said attachment portion.

10. A connector for a circuit board, the connector comprising a housing for attachment to a circuit board having a connecting hole, an elongate terminal extending from the housing, the terminal having an end adapted to be electrically fixed in said connecting hole, and a substantially planar alignment plate, the alignment plate comprising an attachment portion adapted to be fixed relative to the housing and a guide portion having a position fixing hole therethrough for receiving and supporting said terminal adjacent to said end, wherein the alignment plate has a frangible web to link the guide portion and the attachment portion, said frangible web, in use, being broken to permit relative movement between the guide portion and the attachment portion thereby to accommodate relative movement between the end of said terminal and said attachment portion in the plane of the attachment portion.

11. A connector according to claim 10 and further including a circuit board, the circuit board defining a throughhole in alignment with said frangible web, said throughhole providing access to the frangible web for the purpose of breaking the web.

12. A connector for a circuit board, the connector comprising a housing for attachment to a circuit board having a connecting hole, an elongate terminal extending from the housing, the terminal having an end adapted to be electrically fixed in said connecting hole, and a substantially planar alignment plate, the alignment plate comprising an attachment portion adapted to be fixed relative to the housing and a guide portion having a position fixing hole therethrough for receiving and supporting said terminal adjacent to said end, wherein said alignment plate has a plurality of frangible webs to link said guide portion and said attachment portion, said frangible webs, in use, being broken to permit relative movement between the guide portion and the attachment portion thereby to accommodate relative movement between the end of said terminal and said attachment portion in the plane of the attachment portion.

13. A connector according to claim 12 and further including a circuit board, the circuit board defining a plurality of throughholes, each throughhole being in alignment with one of said frangible webs, the throughholes providing access to respective frangible webs for the purpose of breaking the webs.

14. A connector according to claim 12 wherein said attachment portion is 'U' shaped, having a base and two arms, the base thereof being adapted to be fixed relative to said housing, and the guide portion being located between said arms.

15. A connector according to claim 14 wherein the plane of the guide portion and the plane of the attachment portion is offset, adjacent edges of the guide portion and attachment portion being non-perpendicular and angled in the same respective direction, opposite edges of the guide portion being angled in opposite directions such that one planar face of the guide portion is narrower than the other planar face, and the narrower planar face being furthest from the attachment portion.

* * * * *